(12) United States Patent
Lee

(10) Patent No.: US 7,314,814 B2
(45) Date of Patent: Jan. 1, 2008

(54) SEMICONDUCTOR DEVICES AND METHODS OF FABRICATING THE SAME

(75) Inventor: Jae-Suk Lee, Icheon-si (KR)

(73) Assignee: Dongbu Electronics Co., Ltd., Seoul (KR)

( * ) Notice: Subject to any disclaimer, the term of this patent is extended or adjusted under 35 U.S.C. 154(b) by 21 days.

(21) Appl. No.: 10/972,189

(22) Filed: Oct. 22, 2004

(65) Prior Publication Data
US 2005/0090092 A1    Apr. 28, 2005

(30) Foreign Application Priority Data
Oct. 22, 2003  (KR) .................. 10-2003-0073898

(51) Int. Cl.
*H01L 21/3205* (2006.01)
*H01L 21/4763* (2006.01)
(52) U.S. Cl. .................. 438/588; 438/592; 438/179; 438/283
(58) Field of Classification Search .............. 438/283, 438/588, 592, 179; 257/288
See application file for complete search history.

(56) References Cited

U.S. PATENT DOCUMENTS

| 5,767,004 | A | 6/1998 | Balasubramanian et al. |
| 6,180,501 | B1 * | 1/2001 | Pey et al. ............... 438/592 |
| 6,507,078 | B1 * | 1/2003 | Yu .......................... 257/388 |
| 6,562,731 | B2 * | 5/2003 | Liu et al. ................ 438/778 |
| 6,638,801 | B2 * | 10/2003 | Manabe .................. 438/179 |
| 6,740,549 | B1 | 5/2004 | Chen et al. |
| 6,777,761 | B2 * | 8/2004 | Clevenger et al. ....... 257/388 |
| 6,870,231 | B2 * | 3/2005 | Kim et al. ............... 257/379 |
| 2004/0173825 | A1 * | 9/2004 | Lyu et al. ................ 257/288 |

* cited by examiner

*Primary Examiner*—Theresa T. Doan
(74) *Attorney, Agent, or Firm*—Saliwanchik, Lloyd & Saliwanchik

(57) ABSTRACT

Semiconductor devices and methods of fabricating the same are disclosed. A disclosed method comprises: partially forming a first gate stack; partially forming a second gate stack adjacent the first gate stack; forming a first interlayer dielectric; and completing the formation of the first and second gate stacks after the first interlayer dielectric has filled a distance between the first and second gate electrodes.

10 Claims, 5 Drawing Sheets

US 7,314,814 B2

SEMICONDUCTOR DEVICES AND METHODS OF FABRICATING THE SAME

FIELD OF THE DISCLOSURE

The present disclosure relates generally to semiconductor fabrication and, more particularly, to semiconductor devices and methods of fabricating the same.

BACKGROUND

As the integration density of semiconductor devices has increased, the metal interconnect structure has become increasingly smaller in size. Accordingly, the structure of an interlayer dielectric (ILD) layer, (e.g., a pre-metal dielectric (PMD) layer), has been greatly changed.

FIG. 1 through FIG. 3 are cross-sectional views illustrating a conventional process of fabricating a semiconductor device. As shown in FIGS. 1-3, a semiconductor substrate 1 which has an active region defined by at least one device isolation layer 2 is prepared. Gate electrodes 5 comprising a gate insulating layer 3 and a polysilicon layer 4 are formed on the active region. Spacers 6 are then formed on both sidewalls of the gate electrodes 5. Impurities to form source/drain regions (not shown) are then implanted into the semiconductor substrate 1 by using the spacers 6 as a mask. Subsequently, an ILD layer, for example, a PMD layer 7, is deposited over the structure of FIG. 2. Contact holes 8 are formed through the PMD layer 7 and, then, filled with conductive material to form contact plugs 9. Metal interconnects 10 are formed over the PMD layer 7. The metal interconnects 10 are electrically connected to the gate electrodes 5 by the contact plugs 9 as shown in FIG. 3.

However, due to the high integration of the semiconductor device, the space D between adjacent gate electrodes 5 has increasingly been reduced. Therefore, filling the narrow gaps between the gate electrodes 5 becomes very difficult with conventional semiconductor fabrication technologies. More specifically, as the gaps between the gate electrodes 5 become narrow, the filling density of the PMD layer 7 between the gate electrodes 5 becomes low. As a result, defects such as voids are created in the PMD layer 7. Such defects may prevent the PMD layer 7 from completely insulating the gate electrodes 5 with respect to one another, thereby causing device deterioration due to insulation failure between the gate electrodes 5.

As an alternative, an aspect ratio (h to W) of the gate electrodes 5 may be decreased by reducing the thickness 'h' of the gate electrodes 5. This reduction in the aspect ration improves the filling density of the PMD layer 7 to some extent and, thus, suppresses or eliminates void formation in the PMD layer 7. In this approach, however, the resistance of the gate electrodes 5 is increased, which can cause another problem.

Accordingly, reliable solutions to overcome such problems have been sought by semiconductor industry. For example, Chen et al., U.S. Pat. No. 6,740,549, describe gate structures with sidewall spacers having improved profiles to suppress or eliminate defects between the gate structures during gap-filling. Chen et al. also describe a method of forming the gate structures over a semiconductor substrate. The method described in the Chen et al. Patent includes selectively depositing a liner over multi-layer gate stacks such that the liner is substantially thinner on a capping nitride layer than on a conductive layer, forming a nitride spacer over the liner, and forming a PMD layer over the resulting structure.

DETAILED DESCRIPTION

Figure 1:
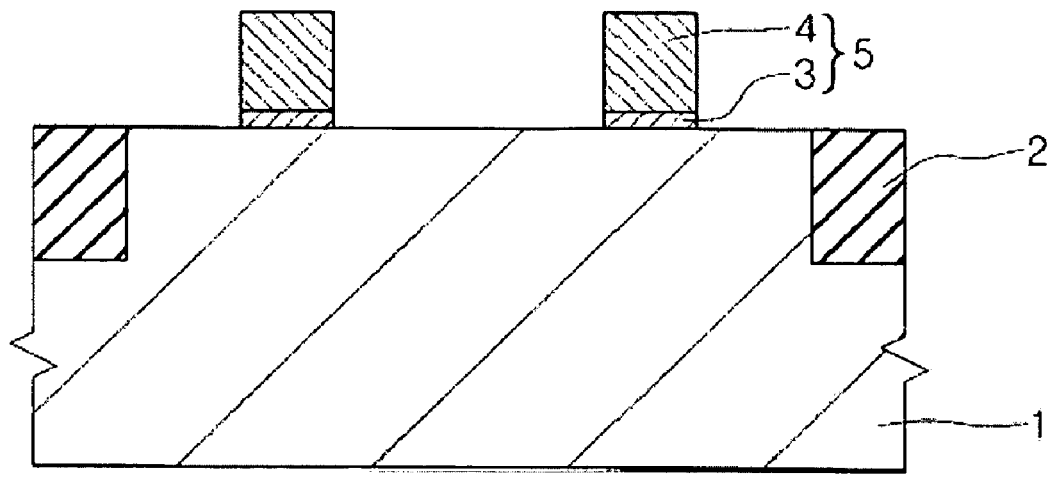
FIG. 1 through FIG. 3 are cross-sectional views illustrating a conventional process of fabricating a semiconductor device.
Figure 2:
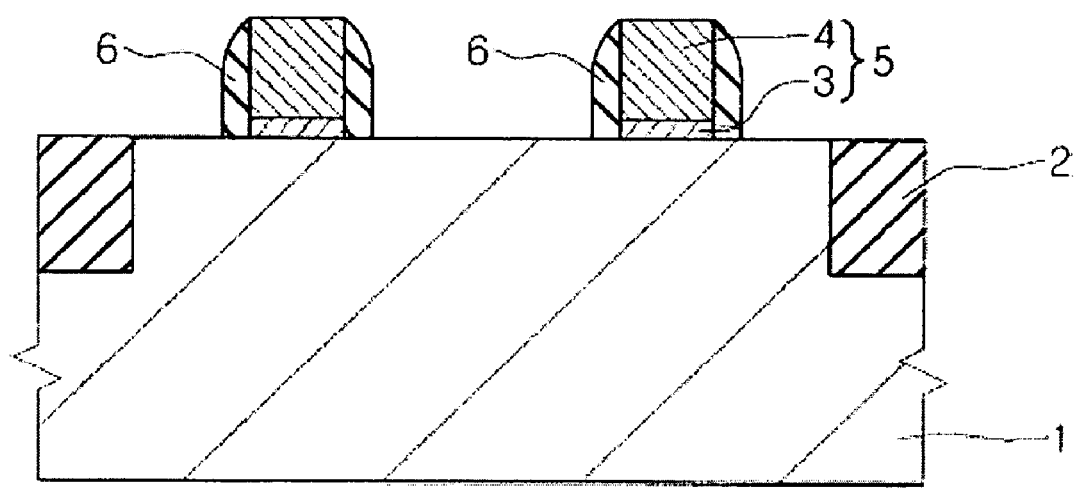
Figure 3:
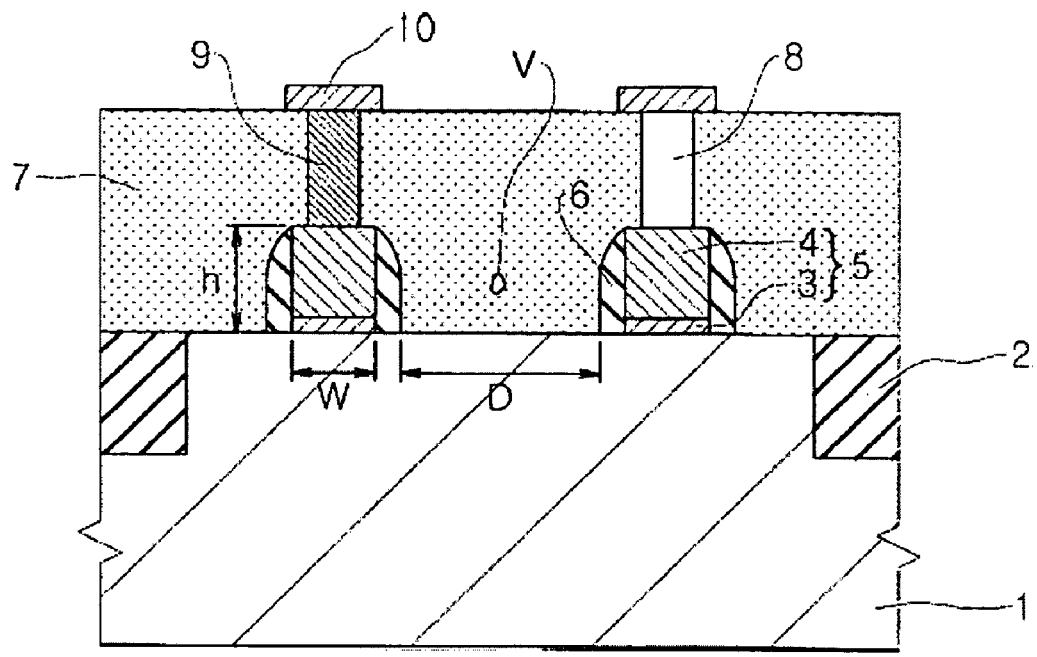
Figure 4:
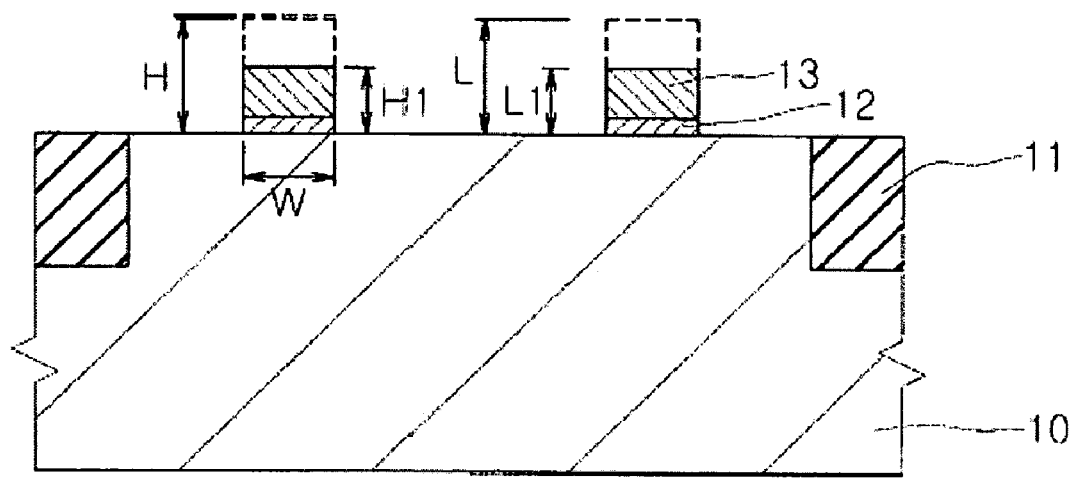
FIG. 4 through FIG. 9 are cross-sectional views illustrating an example process of fabricating a semiconductor device performed in accordance with the teachings of the present invention.

Referring to FIG. 4, a semiconductor substrate 10 having an active region defined by at least one device isolation layer 11 is prepared. The device isolation layer 11 is formed through a shallow trench isolation (STI) process comprising forming a trench within a device isolation region of the semiconductor substrate 10, and then performing gap-filling and patterning processes. The device isolation layer 11 may be formed through a local oxidation of silicon (LOCOS) process instead of the STI process. An insulating layer is grown on the top surface of the active region of the semiconductor substrate 10 by a thermal oxidation process. A first conductive layer is then formed on the insulating layer by a chemical vapor deposition (CVD) process. The first conductive layer and the insulating layer are etched using a photolithography process to form gate insulating layers 12 and first gate electrodes 13 within the active region of the semiconductor substrate 10. In the example of FIG. 4 the thickness $H_1$ of the first gate electrode 13 and the gate insulating layer 12 is preferably between 10% and 90% of the thickness H of the desired gate stack to be finally formed. Therefore, the depth of the gap between adjacent gate electrodes 13 is reduced to L1 in comparison to depth L of that of the gate stacks to be finally formed (see FIG. 4).

Figure 5:
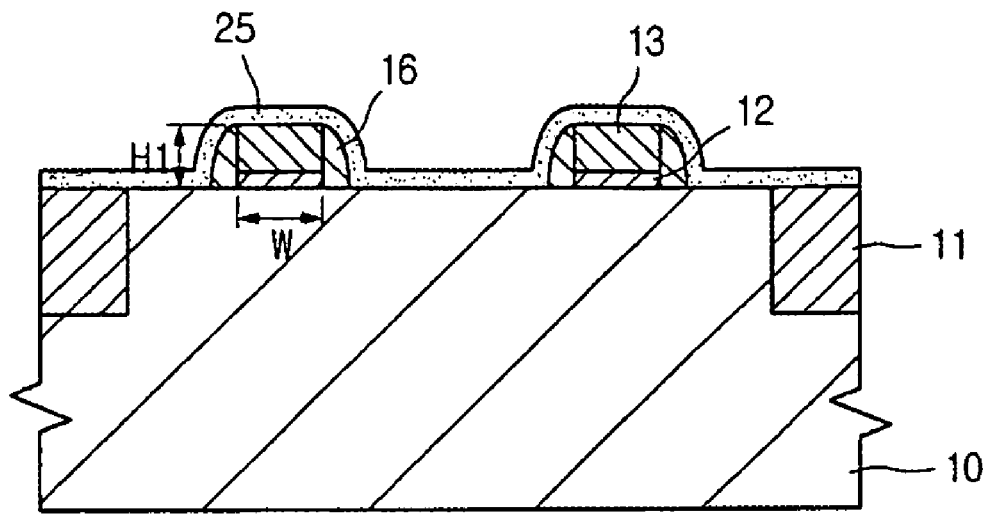

Referring to FIG. 5, an oxide layer and a nitride layer are sequentially deposited over the semiconductor substrate 10 and the first gate electrodes 13 by CVD processes. The oxide layer and the nitride layer are then etched by a dry etching process having an anisotropic etching characteristic, (e.g., a reactive ion etch process), to form spacers 16 on the sidewalls of the first-rate electrodes 13 and the gate insulating layers 12. An ion implantation process is then performed using the spacers 16 as a mask to implant high concentration impurities into the active region of the semiconductor substrate 10. Subsequently, high concentration source/drain regions (not shown) are formed in the semiconductor substrate 10. An etch protective layer 25 is additionally formed over the resulting structure by a CVD process. The etch protective layer 25 is preferably an oxide layer or a nitride layer.

Figure 6:
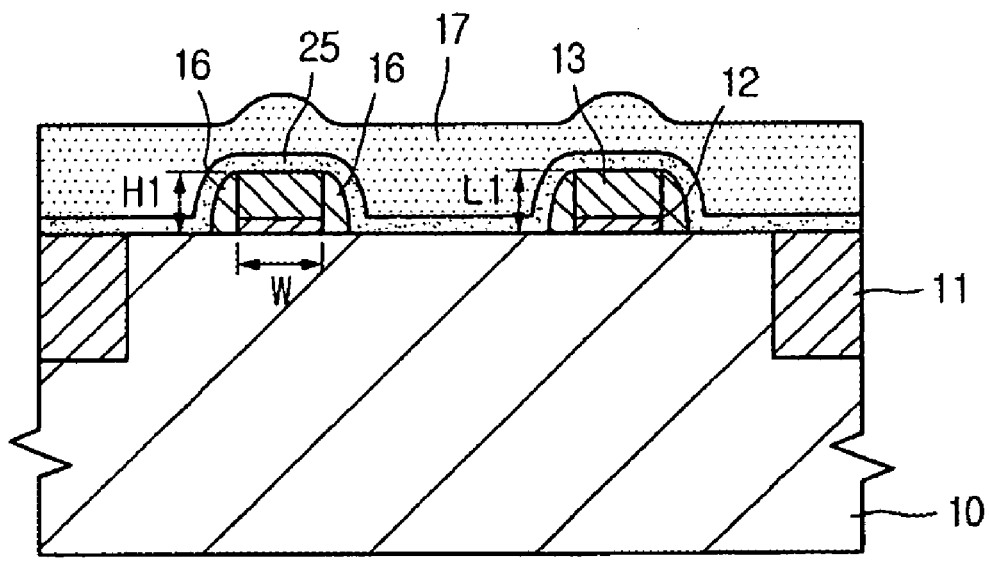

Referring to FIG. 6, a PMD layer 17 is deposited over the structure of FIG. 5. The PMD layer 17 of FIG. 6 completely covers the structure of FIG. 5 and completely fills the gaps between the first gate electrodes 13. The PMD layer 17 is preferably a single or multi layer made of one or more of: undoped silicate glass (USG), boron silicate glass (BSG), phosphorus silicate glass (PSG), boron-phosphurus silicate glass (BPSG), and/or ozone tetra ethyl ortho silicate ($O_3$-TEOS).

As described above, the depth of the gap between the gate electrodes 13 is reduced to L1 as the thickness H1 of the first gate electrodes 13 is lowered to 10~90% of that of the gate stack to be finally formed. As a result, the filling density of the PMD layer 17 to fill the gaps between the gate electrodes is greatly improved, thereby ensuring no defects are formed in the PMD layer 17 between the first gate electrodes 13.

Figure 7:
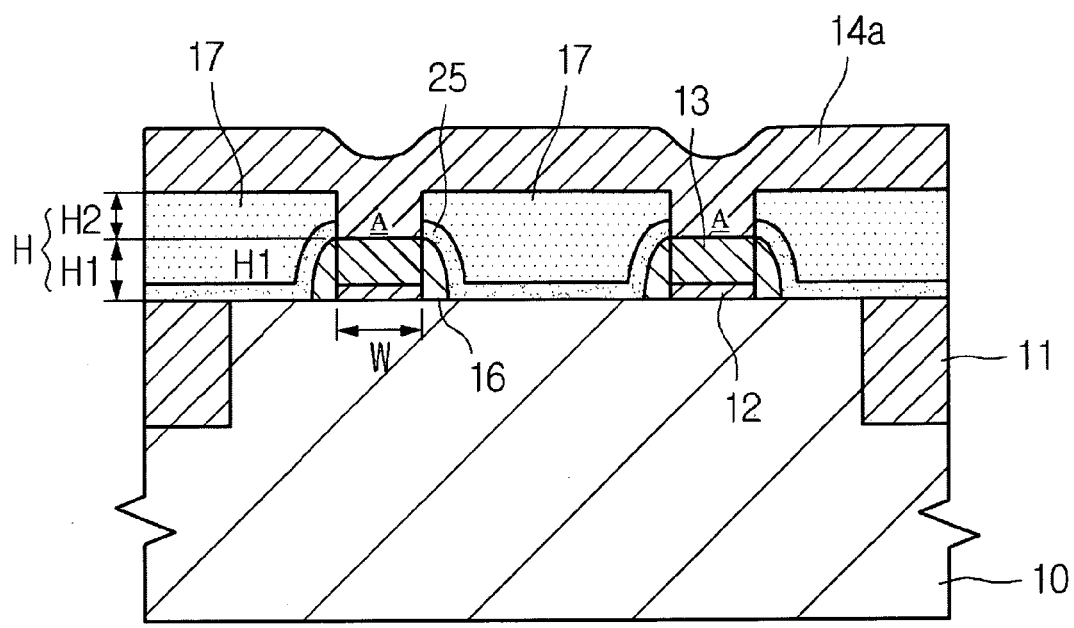

Referring to FIG. 7, the PMD layer 17 is etched by using a photolithography process to form open spaces A exposing the top surfaces of the first gate electrodes 13. A metal layer 14a is then deposited over the resulting structure so as to completely fill the open spaces A. The metal layer 14a is preferably formed of polysilicon, tungsten, aluminum, or copper.

Figure 8:
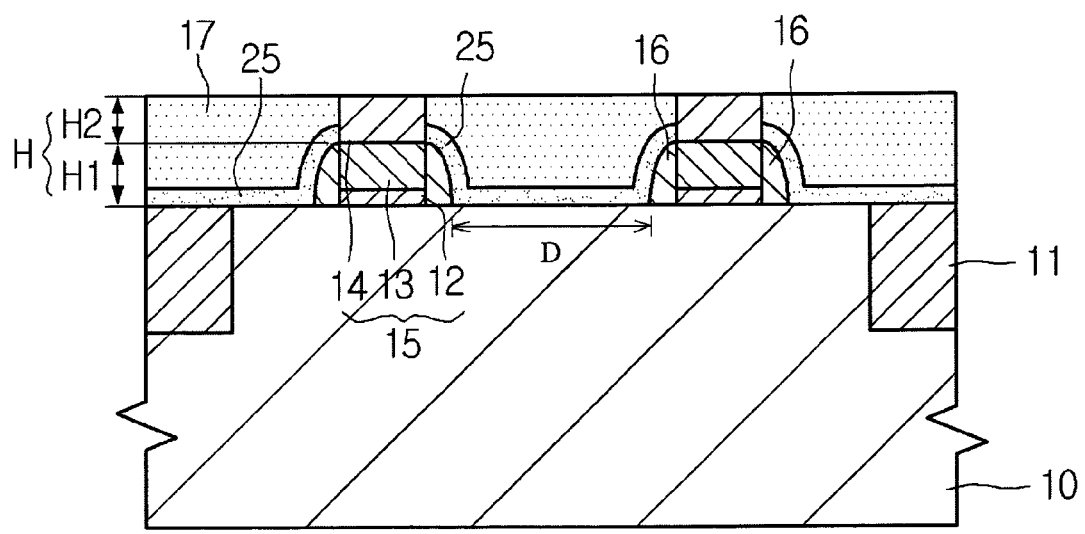

Referring to FIG. 8, a planarization process, (for example, chemical mechanical polishing), is performed on the resulting substrate to form second gate electrodes 14. Thus, desired gate stacks 15 comprising the second gate electrode 14, the first gate electrode 13, and the gate insulating layer 12 are completed. In the illustrated example, the thickness H2 of the second gate electrode is controlled so that gate stacks 15 have a desired thickness H.

Accordingly, because the second gate electrodes 14 are formed so as to have the appropriate thickness H2 in view of the thickness H1 of the first gate electrodes 13, the completed gate stacks 15 have the desired thickness H. In addition, because the gaps between the second gate electrodes 14 have already been filled with the PMD layer 17 before the second gate electrodes 14 are formed, the second gate electrodes 14 can be formed without concern for the filling density of the PMD layer 17. In other words, the thickness H2 of the second gate electrodes 14 can be increased to an optimum dimension without considering the filling density of the PMD layer 17.

It is generally known that the resistance of a gate electrode decreases as the thickness of the gate electrode increases. In the prior art, however, the aspect ratio of the gate electrode increases concurrently with the increase of the gate electrode thickness. Therefore, the filling density of the PMD layer becomes lower as the thickness of the prior art gate electrode increases. For this reason, conventional technologies have failed to increase the gate electrode thickness in spite of the need to do so.

In contrast, the processes disclosed herein pre-form the PMD layer 17 prior to the formation of the second gate electrodes 14. As a result, the second gate electrodes 14 can have a large thickness without concern for the filling density of the PMD layer 17. Accordingly, an optimum overall gate thickness H is realized. An increase in the thickness of the second gate electrodes 14 increases the thickness of the gate stacks 15 and, therefore, decreases the gate resistance.

Figure 9:
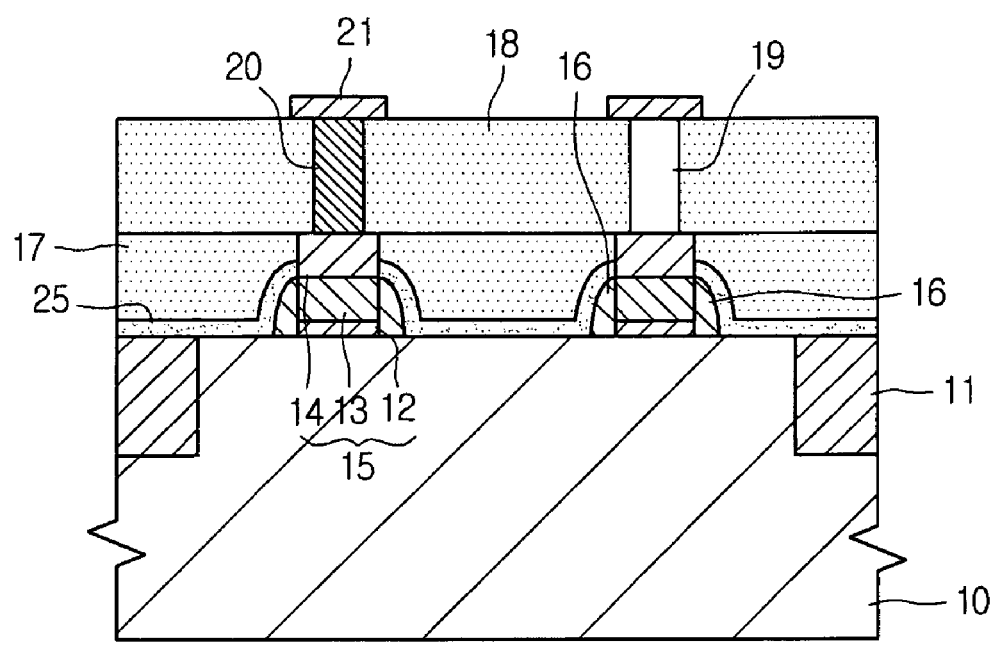

Referring to FIG. 9, a second PMD layer 18 is deposited over the structure of FIG. 8 using a deposition process. The second PMD layer 18 is preferably a single or multi-layer made of USG, BSG, PSG, BPSG, and/or $O_3$-TEOS. The second PMD layer 18 is etched to form contact holes 19 therethrough. The contact holes 19 expose a portion of the second gate electrodes 14. Next, a barrier metal layer (not shown) is formed on the inner sidewalls and bottom of the contact holes 19 by using a sputtering process. A high fusion point metal such as tungsten is then deposited over the resulting structure so that the contact holes 19 are completely filled with the high fusion point metal. The high fusion point metal layer is planarized by CMP to form contact plugs 20. Subsequently, metal interconnects 21 are formed over the resulting structure and electrically connected to the second gate electrodes 14 via the contact plugs 20. As a result, a semiconductor device comprising the metal interconnect 21, the contact plug 20, the second PMD layer 18, the PMD layer 17, the second gate electrodes 14, and the first gate electrodes 13, is completed.

By forming each of the gate stacks 15 from two or more gate electrodes 13, 14 which are made in separate formation steps, the disclosed processes reduce the depth of the gaps to be filled with the PMD layer 17 to effectively increase the filling density of the PMD layer 17, thereby obviating the formation defects due to the low filling density of the PMD layer found in the prior art.

In addition, by increasing the filling density and improving the insulation capacity of the PMD layer 17, the above-described processes can reduce or minimize electric interference between the gate electrodes 15, thereby preventing device characteristic deterioration.

Moreover, the disclosed processes form the gate electrode to have an optimum thickness without negatively impacting the filling density of the PMD layer 17, thereby minimizing the gate resistance. Thus, the disclosed processes ensure that gaps between adjacent gate electrodes are sufficiently filled by a dielectric layer without forming voids therebetween.

It is noted that this patent claims priority from Korean Patent Application Serial Number 10-2003-0073898, which was filed on Oct. 22, 2003, and is hereby incorporated by reference in its entirety.

Although certain example methods, apparatus and articles of manufacture have been described herein, the scope of coverage of this patent is not limited thereto. On the contrary, this patent covers all methods, apparatus and articles of manufacture fairly falling within the scope of the appended claims either literally or under the doctrine of equivalents.

What is claimed is:

1. A method of fabricating a semiconductor device comprising:
   forming a first gate electrode on an active region of a semiconductor substrate;
   forming an etch protective layer on the first gate electrode;
   forming a first interlayer dielectric over the first gate electrode;
   forming an opening through the first interlayer dielectric and the etch protective layer, exposing a top surface of the first gate electrode;
   forming a second gate electrode on the first gate electrode by filling the opening with a conductive material, wherein the first and second gate electrodes together comprise a gate stack;
   forming a second interlayer dielectric over both the second gate electrode and the first interlayer dielectric;
   forming an opening through the second interlayer dielectric exposing a top portion of the second gate electrode;
   filling the opening to form a contact plug; and
   forming a metal interconnect over the second interlayer dielectric, wherein the metal interconnect is electrically connected to the second gate electrode by the contact plug.

2. The method as defined by claim 1, wherein the first gate electrode has a thickness which is between 10% and 90% of a thickness of the gate stack.

3. The method as defined by claim 1, wherein the second gate electrode comprises polysilicon, tungsten, aluminum, or copper.

4. The method as defined by claim 1, wherein the etch protective layer is an oxide layer formed by a CVD process.

5. A method of fabricating a semiconductor device comprising:
   forming first and second gate electrodes on a semiconductor substrate, the first and second gate electrodes being separated by a distance;
   forming an etch protective layer on the first and second gate electrodes;

forming a first interlayer dielectric over the first and second gate electrodes, the first interlayer dielectric filling the distance between the first and second gate electrodes;

forming first and second openings through the interlayer dielectric and the etch protective layer, the first opening exposing a top surface of the first gate electrode and the second opening exposing a top surface of the second gate electrode;

forming a third gate electrode on the first gate electrode by filling the first opening with a conductive material;

forming a fourth gate electrode on the second gate electrode by filling the second opening with a conductive material; wherein the first and third gate electrodes together comprise a first gate stack and the second and fourth gate electrodes together comprise a second gate stack;

forming a second interlayer dielectric over both the third and fourth gate electrodes and the first interlayer dielectric;

forming third and fourth openings through the second interlayer dielectric respectively exposing top portions of the third and fourth gate electrodes;

filling the third and fourth opening to form first and second contact plugs; and forming a metal interconnect over the second interlayer dielectric, wherein the metal interconnect is electrically connected to the third gate electrode by the first contact plug.

6. The method as defined by claim 5, wherein the first gate electrode has a thickness which is between 10% and 90% of a thickness of the first gate stack.

7. The method as defined by claim 5, wherein the second gate electrode comprises polysilicon, tungsten, aluminum, or copper.

8. The method as defined by claim 5, wherein the etch protective layer is an oxide layer formed by a CVD process.

9. A method of forming first and second adjacent gate stacks comprising:

forming a first gate electrode having a thickness less than a desired thickness of the first gate stack;

forming a second gate electrode having a thickness less than a desired thickness of the second gate stack, the first and second gate electrodes being separated by a distance;

forming an etch protective layer on the first and second gate electrodes;

forming a first interlayer dielectric over the first and second gate electrodes to fill the distance between the first and second gate electrodes;

forming first and second openings through the first interlayer dielectric and the etch protective layer, the first opening exposing a top surface of the first gate electrode and the second opening exposing a top surface of the second gate electrode;

forming a third gate electrode on the first gate electrode to form the first gate stack;

forming a fourth gate electrode on the second gate electrode to form the second gate stack;

forming a second interlayer dielectric over both the third and fourth gate electrodes and the first interlayer dielectric;

forming third and fourth openings through the second interlayer dielectric respectively exposing top portions of the third and fourth gate electrodes;

filling the third and fourth opening to form first and second contact plugs; and forming a metal interconnect over the second interlayer dielectric, wherein the metal interconnect is electrically connected to the third gate electrode by the first contact plug.

10. The method as defined by claim 9, wherein the etch protective layer is an oxide layer formed by a CVD process.

* * * * *